United States Patent
Esch, Jr.

(10) Patent No.: US 8,035,438 B2
(45) Date of Patent: Oct. 11, 2011

(54) INTEGRATED CIRCUITS AND METHODS FOR ENABLING HIGH-SPEED AC-COUPLED NETWORKS TO SUPPRESS NOISE DURING LOW-FREQUENCY OPERATION

(75) Inventor: Gerald Lee Esch, Jr., Fort Collins, CO (US)

(73) Assignee: Avego Technologies ECBU IP (Singapore) Pte. Ltd., Singapore (SG)

( * ) Notice: Subject to any disclaimer, the term of this patent is extended or adjusted under 35 U.S.C. 154(b) by 287 days.

(21) Appl. No.: 12/467,259

(22) Filed: May 16, 2009

(65) Prior Publication Data

US 2010/0289565 A1    Nov. 18, 2010

(51) Int. Cl.
    *H03L 5/00* (2006.01)
(52) U.S. Cl. ............... 327/306; 327/67; 327/332
(58) Field of Classification Search .......... 327/65, 327/67, 306, 316, 323, 331, 332
See application file for complete search history.

(56) References Cited

U.S. PATENT DOCUMENTS

| | | | |
|---|---|---|---|
| 5,565,812 A | 10/1996 | Soenen | |
| 7,222,278 B2 | 5/2007 | Moore et al. | |
| 7,288,980 B2 * | 10/2007 | Lundberg | 327/298 |
| 7,385,443 B1 | 6/2008 | Denison | |
| 2004/0086061 A1 * | 5/2004 | Lundberg | 375/316 |
| 2006/0158223 A1 * | 7/2006 | Wang et al. | 326/86 |
| 2008/0048746 A1 | 2/2008 | Raman | |

OTHER PUBLICATIONS

Secareanu, R.M. et al., "A Differential High-Speed Digital CMOS Buffer With Hysteresis for Improved Noise Immunity," ASIC/SOC Conference, 2000. Proceedings 13th Annual IEEE International, 2000, pp. 326-329.

* cited by examiner

*Primary Examiner* — Long Nguyen

(57) ABSTRACT

An alternating-current (AC) coupling integrated circuit (IC) suppresses signal errors introduced by a steady-state input signal. The IC includes an operational amplifier, a true direct-current (DC) bias network, a complimentary DC-bias network and first and second feedback elements. The operational amplifier has an inverting input, a non-inverting input and an output. The true DC-bias network has first and second branches that are coupled to one another and the non-inverting input. The complimentary DC-bias network has third and fourth branches that are coupled to one another and the inverting input. First and second feedback elements generate first and second control signals in response to a characteristic of one of the true input signal and the complimentary input signal. The control signals prevent the voltage at the inputs to the operational amplifier from reaching an equivalent, steady-state, DC-bias voltage.

20 Claims, 14 Drawing Sheets

INTEGRATED CIRCUITS AND METHODS FOR ENABLING HIGH-SPEED AC-COUPLED NETWORKS TO SUPPRESS NOISE DURING LOW-FREQUENCY OPERATION

BACKGROUND

Traditional alternating-current (AC) coupled interconnect circuits are used for distributing clocks or other signals that are characterized by regular switching rates. A conventional interconnect circuit is illustrated in FIG. 1. The conventional interconnect circuit 10 is located on a printed circuit assembly 5 and includes a direct-coupled (DC) blocking capacitor 12 and a DC-bias network 14. The interconnect circuit 10 is inserted between a clock source 6 and an integrated circuit package 8 that uses a clock signal generated by the clock source 6. The interconnect circuit 10 has an input node 11 and an output node 17. The input node 11 is coupled to the clock source 6. The output node 17 is coupled to the integrated circuit package 8. The DC-blocking capacitor 12 is coupled between the input node 11 and the output node 17. The DC-bias network 14 includes a first branch 16 coupled between the output node 17 and a supply voltage, labeled $V_{DD}$ and a second branch 18, coupled between the output node 17 and a second voltage, labeled $V_{SS}$. In an example embodiment, $V_{DD}$ is 1.0 Volts, $V_{SS}$ is 0.0 Volts and the first branch 16 and the second branch 18 of the DC-bias network 14 each include a resistor with an electrical resistance of $R_1$ Ohms.

FIG. 2 includes a graphical representation of an input signal (i.e., a signal from the clock source 6) and an output signal (i.e., a signal at the IC package) for the interconnect circuit 10 of FIG. 1. FIG. 2 represents time along the horizontal axis and electrical potential in volts along the vertical axis. The input signal is represented by trace 21. The output signal is represented by trace 27. The input signal, as represented by trace 21, is a time-varying and periodic signal that begins at approximately 0.8 V and transitions over a relatively brief duration of time to approximately 1.5 V, where it remains for a longer duration of time or a peak interval before returning to 0.8 V. Trace 21 has a peak-to-peak voltage of approximately 0.7 V and a common-mode or average voltage of approximately 1.15 V. The input signal is symmetric about the common-mode voltage.

The output signal, as represented by trace 27, is a time-varying and periodic signal that is offset in voltage from the input signal. The output signal begins at approximately 0.15 V and transitions over the same relatively short interval, during which the input signal transitioned, until the output signal is approximately 0.85 V. The output signal remains at 0.85 V during a peak interval that corresponds to the peak interval of the input signal before returning to 0.15 V. The output signal, as represented by trace 27, has approximately the same peak-to-peak voltage (i.e., 0.7 V) as that of the input signal. However, the common-mode voltage of the output signal is about 0.5 V, which is approximately 0.6 V lower than the common-mode voltage of the input signal. The common-mode voltage of the output signal is determined by the voltage difference between the supply voltage, or $V_{DD}$, and the second voltage, or $V_{SS}$ and the resistance values of the resistors in the first branch 16 and the second branch 18 of the DC-bias network 14.

Thus, the DC-blocking capacitor 12 of the conventional interconnect circuit 10 isolates the DC bias of two circuits. Stated another way, the interconnect circuit 10 shifts the common-mode voltage of a time-varying and periodic signal to an integrated circuit bias voltage. As illustrated by the trace 21 and the trace 27, the relative timing, the peak-to-peak voltage and the slew or transition rate remains unchanged by the interconnect circuit 10.

When the input signal fails to transition, such as when a clock signal is halted or interrupted, the DC-bias network 14 will charge/discharge the DC blocking capacitor 12 to the DC-bias voltage (i.e., $(V_{DD}-V_{SS})/2$). For clock applications this is an undesirable behavior. When a differential clock signal with two AC-coupled inputs using the interconnect circuit 10 of FIG. 1A, encounters an interruption in the clock signal, such as when the input signal is halted (i.e., when the input signal no longer transitions), the true and complimentary signals at the respective output nodes of the interconnect circuits will exponentially decay and exponentially charge until the true and complimentary output signals reach the DC-bias voltage. As a result, a differential amplifier driven by those output nodes can generate undesired glitches or errors in the presence of electrical noise. In addition, the presence of the interconnect circuits will prevent the clock receiver from receiving suitable true and complimentary signals for some time after the differential clock signals at the input have resumed.

Increasing the time constant of the DC-bias network 14, which is responsible for the exponential decay or exponential charge of the output voltage, is one possibility for suppressing or reducing clock signal errors introduced by the noise induced glitches in a clock receiver. However, this approach requires relatively large circuit elements and only increases the time that the clock receiver will not be susceptible to clock signal glitches induced by a clock halt as the clock cannot be halted indefinitely.

Another possible solution is to introduce a hysteresis response in the clock receiver. However, a hysteresis response will corrupt the duty cycle of the clock signal due to variations in the circuit device manufacturing process, voltage and temperature.

SUMMARY

An embodiment of an alternating-current (AC) coupling integrated circuit (IC) for suppressing signal errors introduced by a steady-state input comprises an operational amplifier, a true direct-current (DC) bias network, a complimentary DC-bias network and first and second feedback elements. The operational amplifier includes an inverting signal input, a non-inverting signal input, and an output. The true DC-bias network includes a first branch and a second branch that are coupled to each other and to the non-inverting signal input. The complimentary DC-bias network includes a third branch and a fourth branch that are coupled to each other and to the inverting signal input. The first feedback element is coupled to the output of the operational amplifier and generates a first control signal in response to a characteristic of the input signal. The second feedback element is coupled to the output of the operational amplifier and generates a second control signal in response to a characteristic of the input signal.

An embodiment of a method for enabling high-speed AC-coupled networks to suppress noise during low-frequency operation includes the steps of coupling a true DC-bias network having a first branch and a second branch to the non-inverting signal input of an operational amplifier, coupling a complimentary DC-bias network having a third branch and a fourth branch to the inverting input of an operational amplifier, using a first feedback element coupled between an output of the operational amplifier and one of the true DC-bias network and the complimentary DC-bias network to generate a first control signal in response to a characteristic of a true input signal applied to one of the true DC-bias network and a complimentary input signal applied to the complimentary DC-bias network, controllably applying the first control signal to at least one of the first branch of the true DC-bias network and the third branch of the complimentary DC-bias network, using a second feedback element coupled between the output of the operational amplifier and one of the true DC-bias network and the complimentary DC-bias network to generate a second control signal in response to the characteristic of the true input signal applied to one of the true DC-bias network and the complimentary input signal applied to the complimentary DC-bias network, and controllably applying the second control signal to at least one of the second branch of the true DC-bias network and the fourth branch of the complimentary DC-bias network.

The figures and detailed description that follow are not exhaustive. The disclosed embodiments are illustrated and described to enable one of ordinary skill to make and use the circuits and methods for enabling high-speed AC-coupled networks to suppress noise during low-frequency operation. Other embodiments, features and advantages of the circuits and methods will be or will become apparent to those skilled in the art upon examination of the following figures and detailed description. All such additional embodiments, features and advantages are within the scope of the circuits and methods as defined in the accompanying claims.

BRIEF DESCRIPTION OF THE FIGURES

The circuits and methods for enabling high-speed AC-coupled networks to suppress noise during low-frequency operation can be better understood with reference to the following figures. The components within the figures are not necessarily to scale, emphasis instead being placed upon clearly illustrating the principles of adaptively applying feedback to a DC-coupled bias network to suppress signal errors introduced when a time-varying input signal halts or is otherwise interrupted. Moreover, in the figures, like reference numerals designate corresponding parts throughout the different views.

DETAILED DESCRIPTION

An AC-coupling IC uses feedback elements to generate control signals that when controllably applied to select branches of DC-bias networks suppress signal errors introduced by a steady-state input signal. The AC-coupling IC includes an operational amplifier, a true DC-bias network, a complimentary DC-bias network and first and second feedback elements. The operational amplifier has an inverting input, a non-inverting input and an output. The true DC-bias network has first and second branches that are coupled to one another and the non-inverting input. The complimentary DC-bias network has third and fourth branches that are coupled to one another and the inverting input. First and second feedback elements, coupled to the output of the operational amplifier, generate first and second control signals in response to a characteristic of one of the true input signal and the complimentary input signal. The first and second control signals are responsive to the frequency of the input signal. When the frequency of the input signal is equal to or below a threshold frequency, the control signals are enabled after a delay period to prevent the inputs of the operational amplifier from reaching the same steady-state DC-bias voltage. When the frequency of the input signal is above a threshold frequency, the control signals are disabled, thus enabling the AC-coupling circuit to generate an output signal that transitions almost immediately upon the resumption of signal transitions in the input signal.

The first and second control signals adjust an electrical characteristic of the branches of the DC-bias networks to prevent the voltage at the inputs to the operational amplifier from reaching an equivalent voltage under steady-state conditions. The first and second control signals create a mismatch condition in the DC-bias network(s) that prevent(s) the operational amplifier input signals from reaching the same common-mode voltage. First and second feedback elements that are relatively slow to enable a change in the DC-bias network (s) in response to a halted clock signal but relatively fast to disable the change upon the detection of a resumed or nominal clock signal, thus providing acceptable glitch suppression when signal level transitions are not present at the input of the AC-coupling circuit and dramatically decreasing the AC-coupled clock's startup time.

Figure 1:
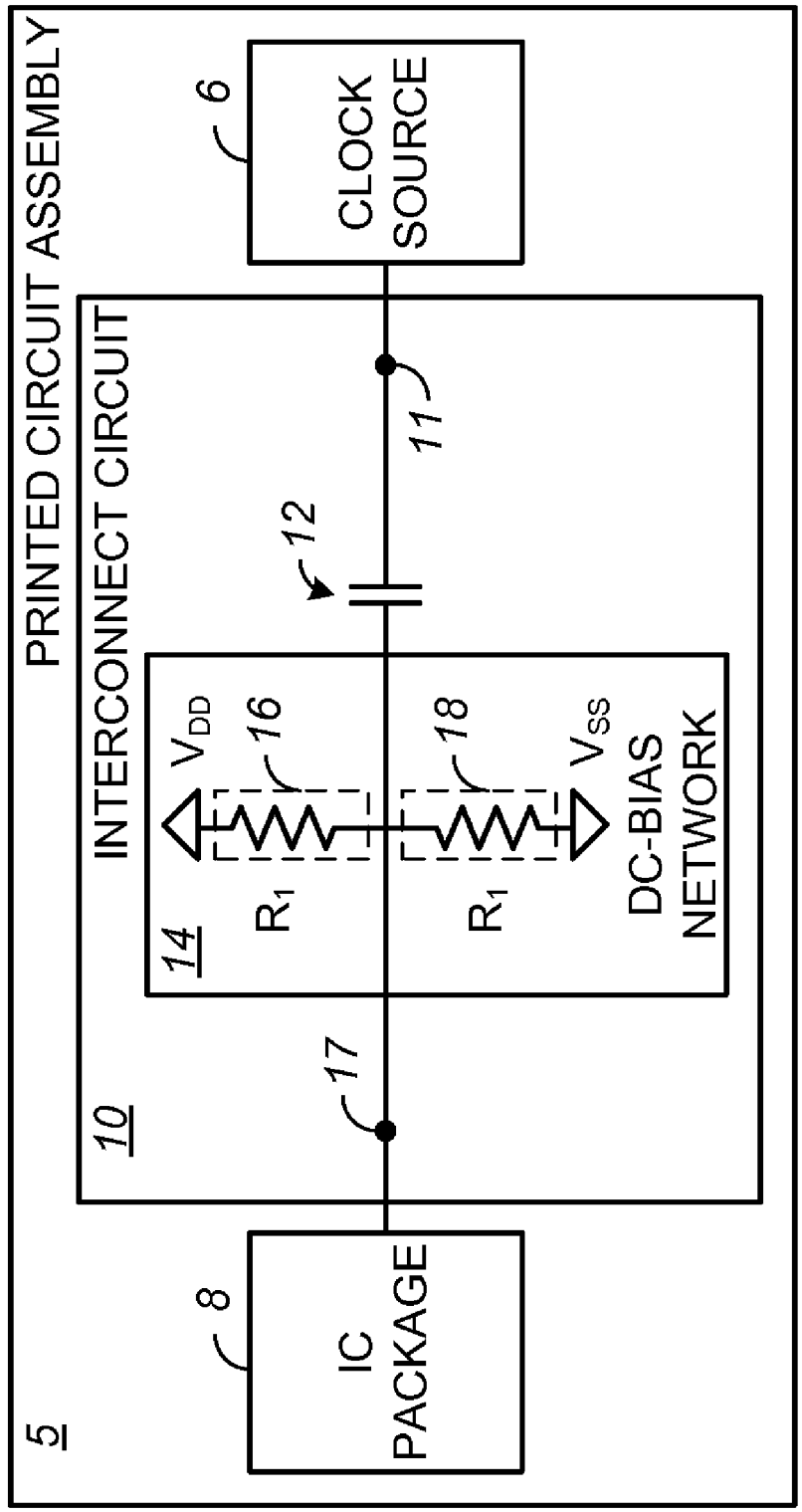
FIG. 1 is a schematic diagram of a printed circuit assembly.
Figure 2:
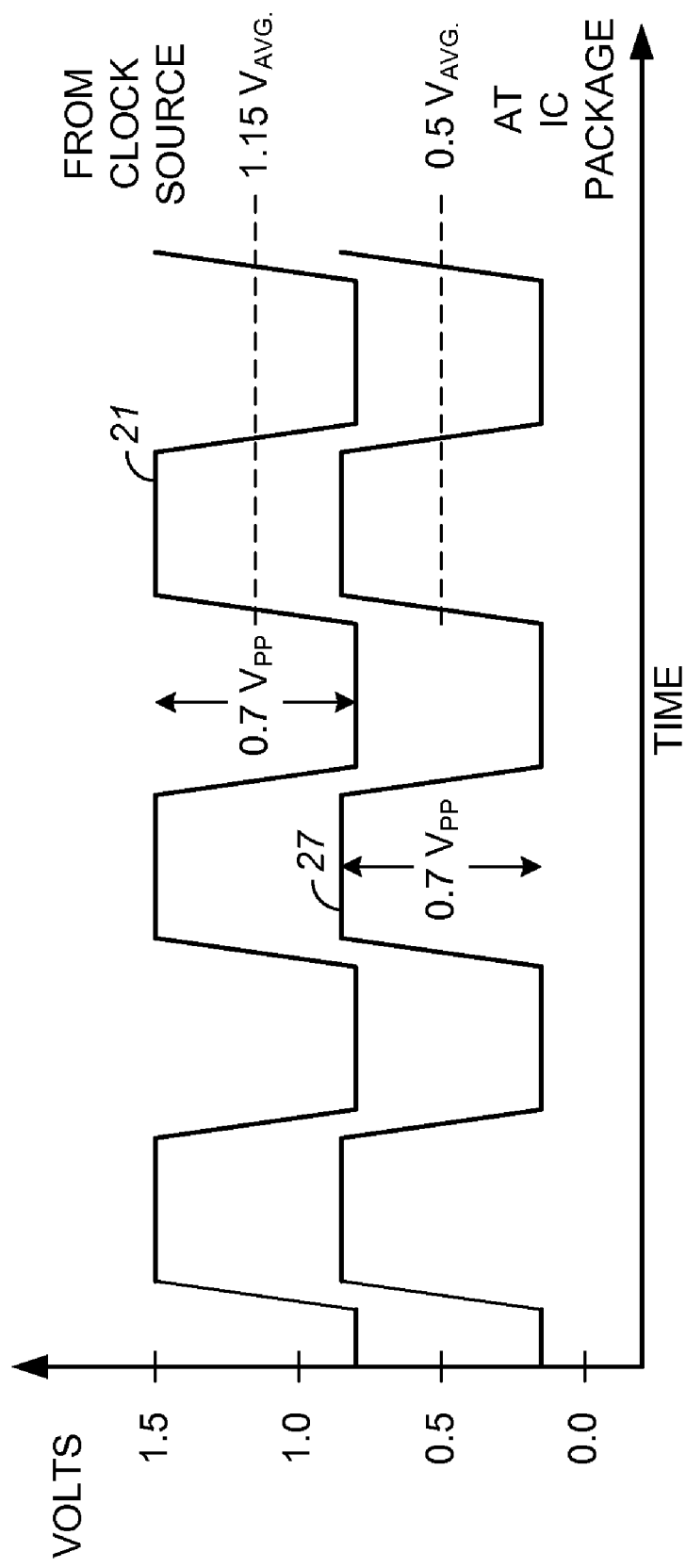
FIG. 2 is a graphical representation of an input signal and an output signal for the interconnect circuit 10 of FIG. 1.
Figure 3:
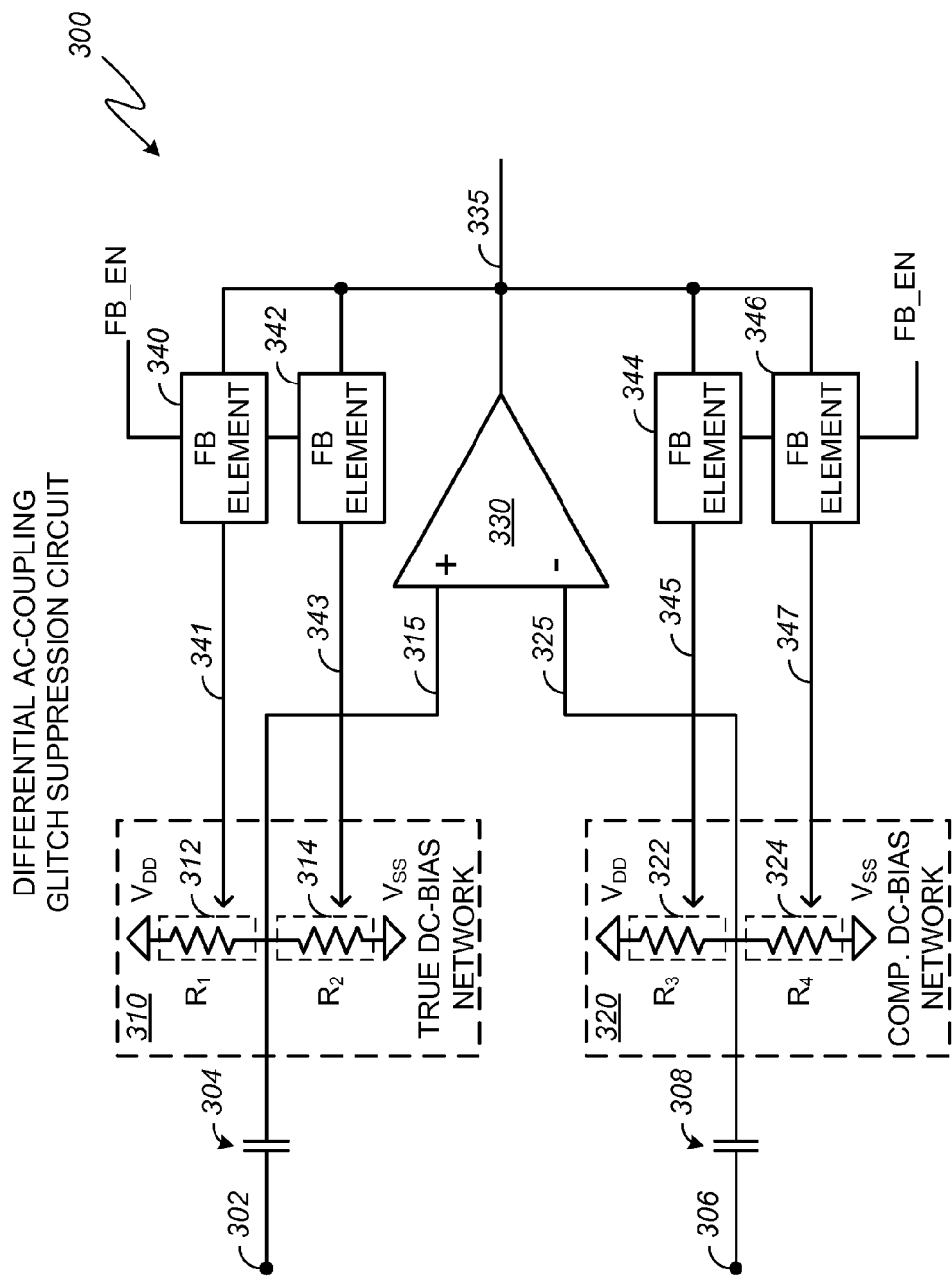
FIG. 3 is a schematic diagram illustrating an embodiment of a differential AC-coupling circuit that employs dual feedback control of DC-bias networks.

Turning now to the drawings, wherein like reference numerals designate corresponding parts throughout the drawings, reference is made to FIG. 3, which includes a schematic diagram illustrating an embodiment of a differential AC-coupling circuit that employs dual feedback control of DC-bias networks. The differential AC-coupling circuit 300 includes a DC-blocking capacitor 304, a DC-blocking capacitor 308, a true DC-bias network 310, a complimentary DC-bias network 320, an operational amplifier 330 and feedback elements 340, 342, 344, and 346. A true input signal applied at input node 302 is coupled via DC-blocking capacitor 304, the true DC-bias network 310 and connection 315 to the non-inverting input of the operational amplifier 330. The DC-bias network 310 includes a first branch 312 coupled to $V_{DD}$ and a second branch 314 coupled to $V_{SS}$. The first branch 312 and the second branch 314 are further coupled to each other and to connection 315. Resistors $R_1$ and $R_2$ comprise the first branch 312 and the second branch 314 of the true DC-bias network 310. When $R_1$ and $R_2$ have equivalent resistance values, the DC-bias voltage (i.e., the common-mode voltage) or voltage at the non-inverting input of the operational amplifier will approximate $(V_{DD}-V_{SS})/2$.

A complimentary input signal applied at input node 306 is coupled via DC-blocking capacitor 308, the complimentary DC-bias network 320 and connection 325 to the inverting input of the operational amplifier 330. The DC-bias network 320 includes a third branch 322 coupled to $V_{DD}$ and a fourth branch 324 coupled to $V_{SS}$. The third branch 322 and the fourth branch 324 are further coupled to each other and to connection 325. Resistors $R_3$ and $R_4$ comprise the third branch 322 and the fourth branch 324 of the complimentary DC-bias network 320. When $R_3$ and $R_4$ have equivalent resistance values, the DC-bias voltage (i.e., the common-mode voltage) or voltage at the inverting input of the operational amplifier will approximate $(V_{DD}-V_{SS})/2$.

Regular signal switching events at input node 302 and input node 306 create edge events at the non-inverting and inverting inputs of the operational amplifier 330. When the signal at the input node 302 and the signal at the input node 306 fail to transition, the voltage at the non-inverting input of the operational amplifier 330 slowly charges/discharges until it reaches the DC-bias voltage and the voltage at the inverting input of the operational amplifier 330 slowly charges/discharges until it reaches the DC-bias voltage. When the DC-bias voltage is reached at both inputs, the output of the operational amplifier 330 will be in an unknown state and the output signal will be highly susceptible to undesired transitions if the operational amplifier's sensitivity is capable of detecting noise at the inverting and non-inverting inputs.

A feedback element 340 receives the output of the operational amplifier on connection 335 and generates a control signal on connection 341. The control signal on connection 341 is generated in accordance with a feedback enable (i.e., FB_EN). Feedback element 340 is responsive to the frequency of the signal at one or both of input node 302 and input node 306. The control signal on connection 341 adjusts an electrical characteristic of the first branch 312 of the true DC-bias network 310.

A feedback element 342 receives the output of the operational amplifier on connection 335 and generates a control signal on connection 343. The control signal on connection 343 is generated in accordance with the feedback enable FB_EN signal. Feedback element 342 is responsive to the frequency of the signal at one or both of input node 302 and input node 306. The control signal on connection 343 adjusts an electrical characteristic of the second branch 314 of the true DC-bias network 310.

The feedback element 340 and the feedback element 342 are slow to make DC-bias resistance adjustments to the first branch 312 and the second branch 314 when input node 302 and/or input node 306 operate below a minimum input frequency. The delay in adjusting the first branch 312 and the second branch 314 of the DC-bias network 310 enables the AC-coupling circuit 300 to not impact performance during normal receiver operation (i.e., when the signal at input node 302 is regularly transitioning) but prevent the voltage at the non-inverting input from reaching the steady-state DC-bias voltage. However, when the output (i.e., the signal on connection 335) of the operational amplifier 330 transitions, the feedback element 340 and the feedback element 342 no longer adjust the first branch 312 and the second branch 314, which enables the DC-bias network 310 to set the DC-bias voltage to its normal operational point at the non-inverting input of the operational amplifier.

A feedback element 344 receives the output of the operational amplifier on connection 335 and generates a control signal on connection 345 in accordance with the FB_EN signal. Feedback element 344 is responsive to the frequency of the signal at one or both of input node 302 and input node 306. The control signal on connection 345 adjusts an electrical characteristic of the third branch 322 of the complimentary DC-bias network 320.

A feedback element 346 receives the output of the operational amplifier on connection 335 and generates a control signal on connection 347 in accordance with the FB_EN signal. Feedback element 346 is responsive to the frequency of the signal at one or both of input node 302 and input node 306. The control signal on connection 347 adjusts an electrical characteristic of the fourth branch 324 of the complimentary DC-bias network 320.

The feedback element 344 and the feedback element 346 are slow to make DC-bias resistance adjustments to the third branch 322 and the fourth branch 324 when inputs nodes 302 and/or 306 operate below a minimum input frequency. The delay in adjusting the first branch 322 and the second branch 324 of the DC-bias network 320 enables the AC-coupling circuit 300 to not impact performance during normal receiver operation (i.e., when the signal at input node 306 is regularly transitioning) but prevent the voltage at the inverting input from reaching the steady-state DC-bias voltage. However, when the output (i.e., the signal on connection 335) of the operational amplifier 330 transitions, the feedback element 344 and the feedback element 346 no longer adjust the first branch 322 and the second branch 324, which enables the DC-bias network 320 to set the DC-bias voltage to its normal operation point at the inverting input of the operational amplifier 330.

When the input frequency is less than a threshold frequency, the feedback elements 340, 342, 344 and 346 generate respective control signals that when applied to the branches 312, 314, 322, and 324 of the DC-bias networks, produce electrical mismatches between the first branch 312 and the second branch 314 of the true DC-bias network 310 and between the third branch 322 and the fourth branch 324 of the complimentary DC-bias network 320. The electrical mismatch in the true DC-bias network 310 results in a voltage at the non-inverting input of the operational amplifier 330 that is greater or less than the common-mode voltage that would result in the absence of the control signals on connection 341 and connection 343. This is accomplished by adjusting the relative resistances of the resistor $R_1$ and the resistor $R_2$ based on the state of node 335. The electrical mismatch in the complimentary DC-bias network 320 results in a voltage at the inverting input of the operational amplifier that is less or greater than the common-mode voltage that would result in the absence of the control signals on connection 345 and connection 347. This is accomplished by adjusting the relative resistances of the resistor $R_3$ and the resistor $R_4$ based on the state of node 335. The goal is to move the DC-bias voltages of nodes 315 and 325 away from the AC common-mode voltage at low input frequencies in order to prevent the inverting and non-inverting inputs to operational amplifier 330 from converging.

Figure 4:
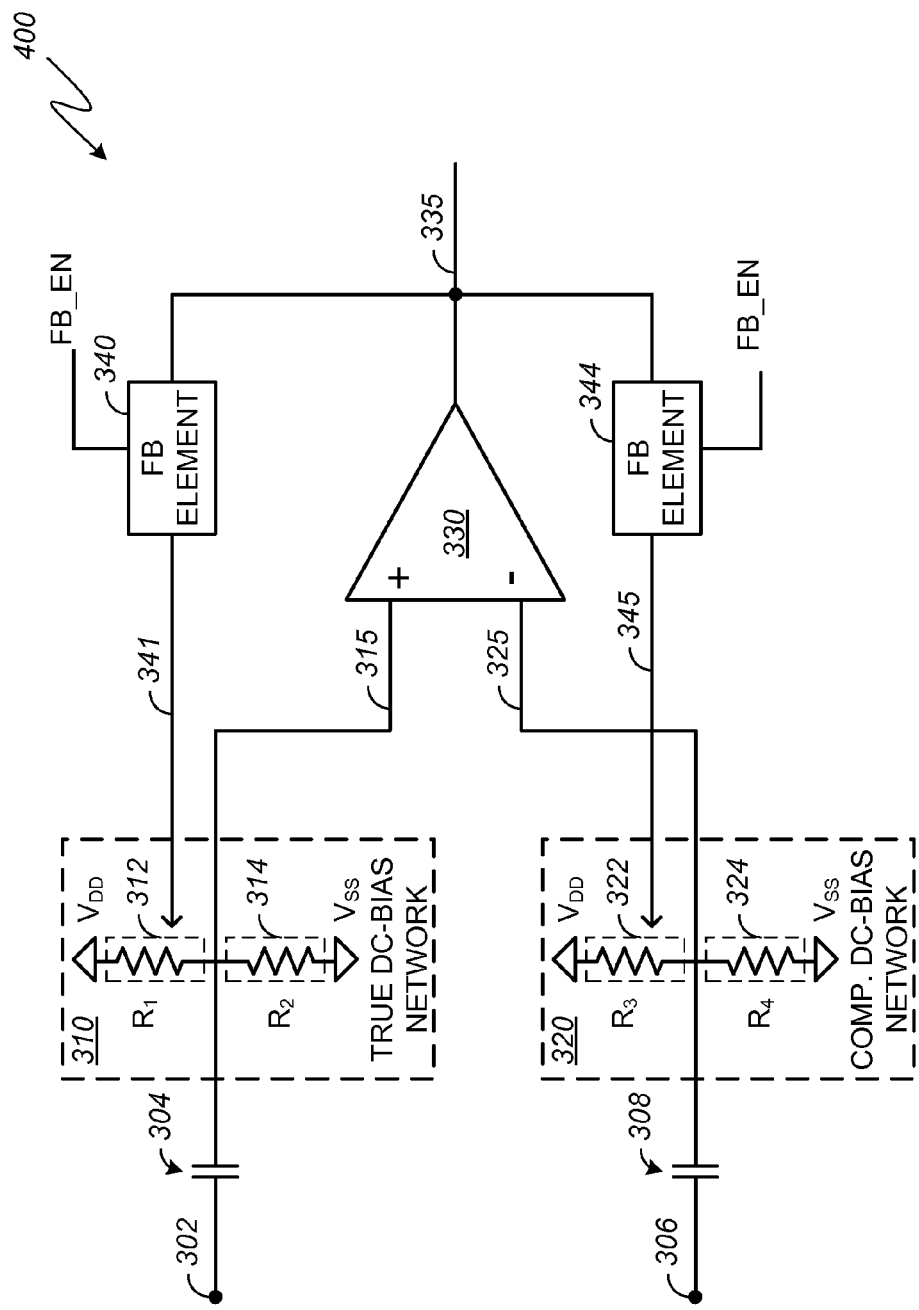
FIG. 4 is a schematic diagram illustrating an embodiment of a differential AC-coupling circuit that employs shared pull-up feedback control of DC-bias networks.

FIG. 4 is a schematic diagram illustrating an embodiment of a differential AC-coupling circuit 400 that employs shared pull-up feedback control of DC-bias networks. The AC-coupling circuit 400 differs from the AC-coupling circuit 300 illustrated in FIG. 3 in that the feedback element 342, connection 343, feedback element 346, and connection 347 are removed. Unlike the dual feedback employed by the circuit illustrated in FIG. 3, the AC-coupling circuit 400 adjusts the true DC-bias network 310 and the complimentary DC-bias network 320 by using the feedback element 340 to generate and apply a control signal to only the first branch 312 of the true DC-bias network 310 and by using the feedback element 344 to generate and apply a control signal to the third branch 322 of the complimentary DC-bias network 320. The AC-coupling circuit 400 adjusts the relative resistances of the resistor $R_1$ such that the resistance of $R_1$ is not equivalent to the resistance of $R_2$. This modifies or offsets the voltage at the non-inverting input of the operational amplifier 330 in the absence of a transitioning signal at input node 302. In addition, the AC-coupling circuit 400 adjusts the relative resistances of the resistor $R_3$ such that the resistance of $R_3$ is not equivalent to the resistance of $R_4$. This modifies or offsets the voltage at the inverting input of the operational amplifier 330 in the absence of a transitioning signal at input node 306.

Figure 5:
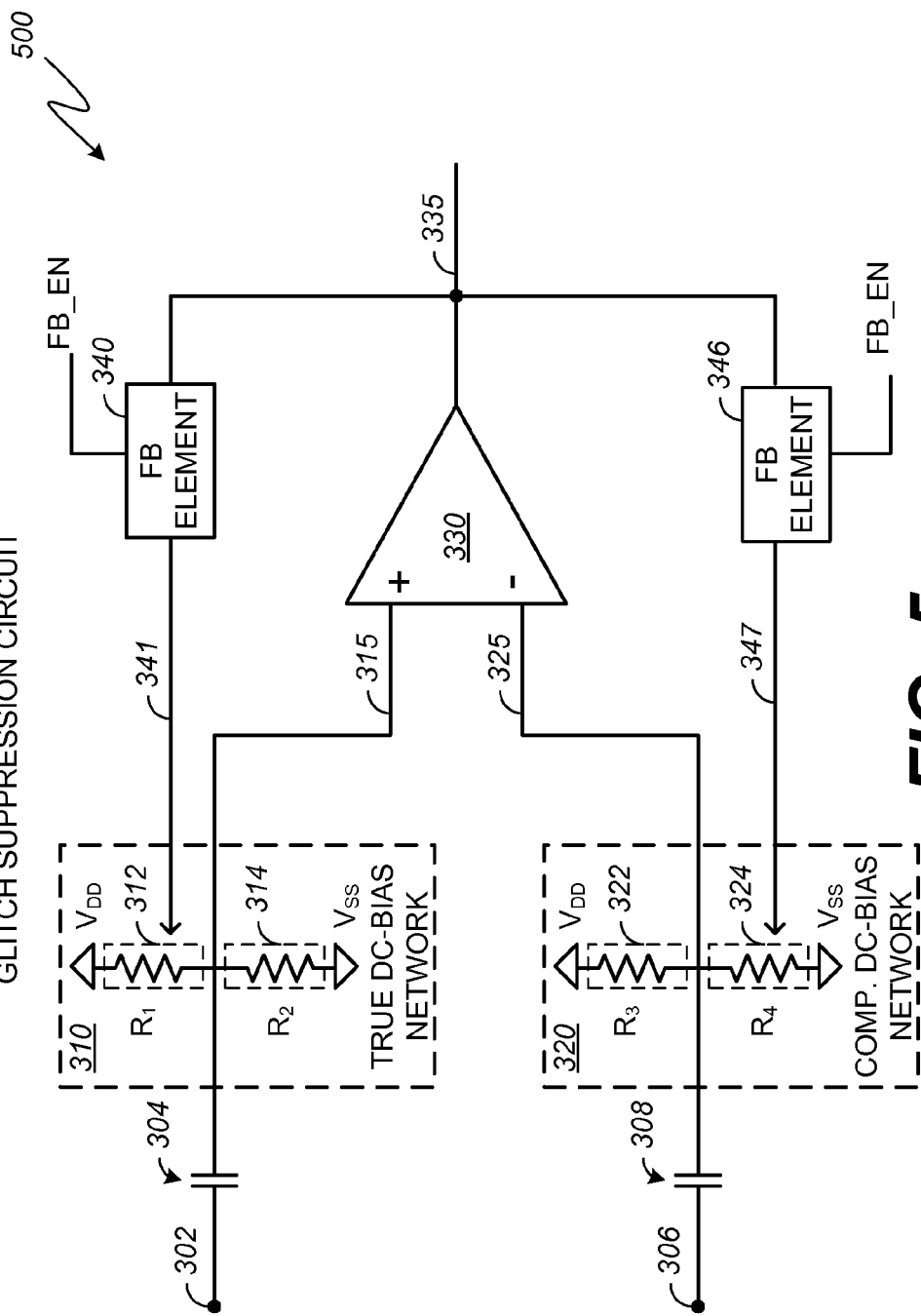
FIG. 5 is a schematic diagram illustrating an embodiment of a differential AC-coupling circuit that employs shared pull-up and pull-down feedback control of DC-bias networks.

FIG. 5 is a schematic diagram illustrating an embodiment of a differential AC-coupling circuit 500 that employs shared pull-up/pull-down feedback control of DC-bias networks. The AC-coupling circuit 400 differs from the AC-coupling circuit 300 illustrated in FIG. 3 in that feedback element 342, connection 343, feedback element 344, and connection 345 are removed. Unlike the dual feedback employed by the circuit illustrated in FIG. 3, the AC-coupling circuit 500 adjusts the true DC-bias network 310 and the complimentary DC-bias network 320 by using the feedback element 340 to generate and apply a control signal to only the first branch 312 of the true DC-bias network 310 and by using the feedback element 346 to generate and apply a control signal to the fourth branch 324 of the complimentary DC-bias network 320. The AC-coupling circuit 500 adjusts the relative resistances of the resistor $R_1$ such that the resistance of $R_1$ is not equivalent to the resistance of $R_2$. This modifies or offsets the voltage at the non-inverting input of the operational amplifier 330 in the absence of a transitioning signal at input node 302. In addition, the AC-coupling circuit 500 adjusts the relative resistances of the resistor $R_4$ such that the resistance of $R_3$ is not equivalent to the resistance of $R_4$. This modifies or offsets the voltage at the inverting input of the operational amplifier 330 in the absence of a transitioning signal at input node 306.

Figure 6:
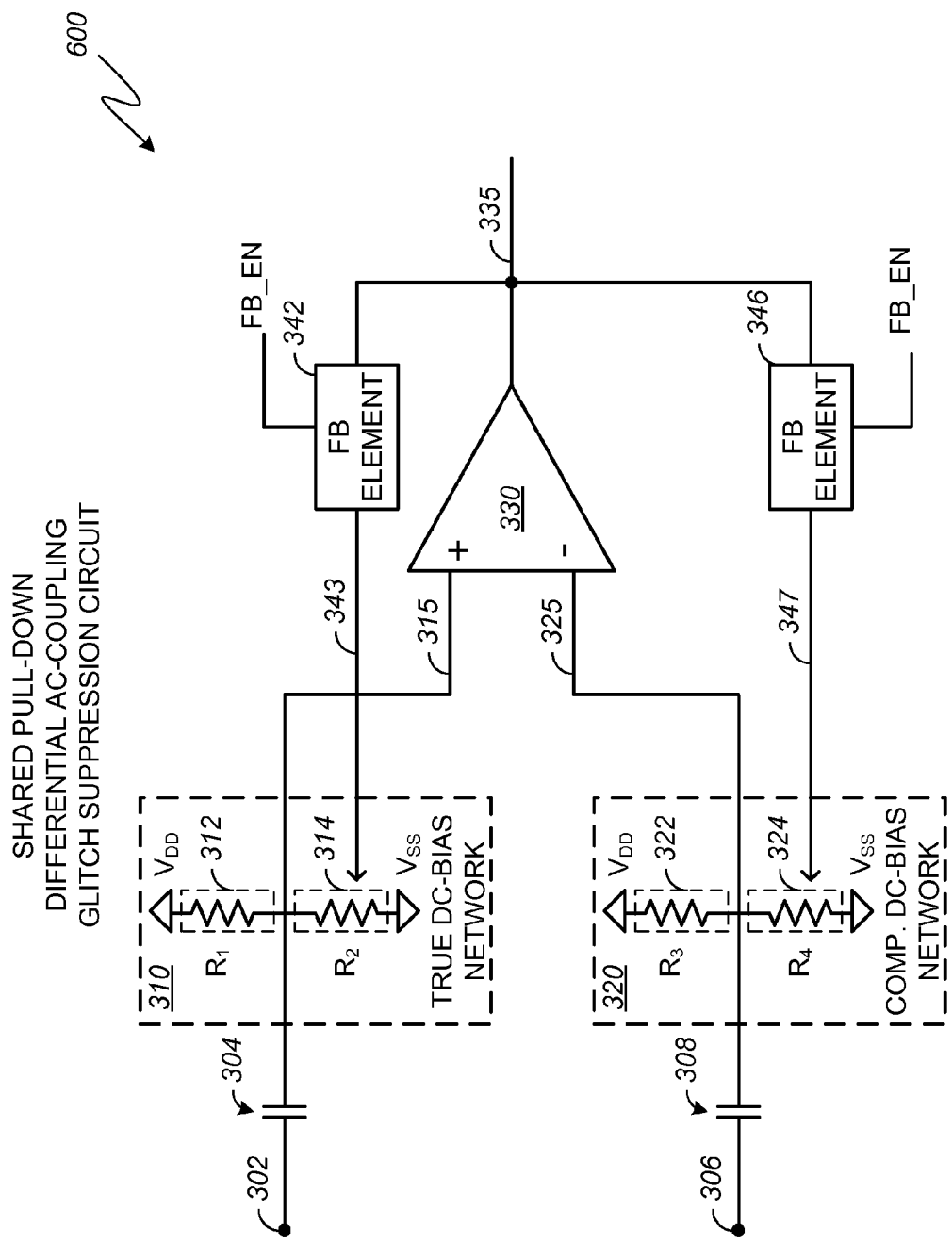
FIG. 6 is a schematic diagram illustrating an embodiment of a differential AC-coupling circuit that employs shared pull-down feedback control in respective DC-bias networks.

FIG. 6 is a schematic diagram illustrating an embodiment of a differential AC-coupling circuit 600 that employs shared pull-down feedback control in respective DC-bias networks. The AC-coupling circuit 600 differs from the AC-coupling circuit 300 illustrated in FIG. 3 in that the feedback element 340, connection 341, feedback element 344, and connection 345 are removed. Unlike the dual feedback employed by the AC-coupling circuit 300 illustrated in FIG. 3, the AC-coupling circuit 600 adjusts the true DC-bias network 310 and the complimentary DC-bias network 320 by using the feedback element 342 to generate and apply a control signal to only the second branch 314 of the true DC-bias network 310 and by using the feedback element 346 to generate and apply a control signal to the fourth branch 324 of the complimentary DC-bias network 320. The AC-coupling circuit 600 adjusts the relative resistances of the resistor $R_2$ such that the resistance of $R_1$ is not equivalent to the resistance of $R_2$. This modifies or offsets the voltage at the non-inverting input of the operational amplifier 330 in the absence of a transitioning signal at input node 302. In addition, the AC-coupling circuit 600 adjusts the relative resistances of the resistor $R_4$ such that the resistance of $R_3$ is not equivalent to the resistance of $R_4$. This modifies or offsets the voltage at the inverting input of the operational amplifier 330 in the absence of a transitioning signal at input node 306.

Figure 7:
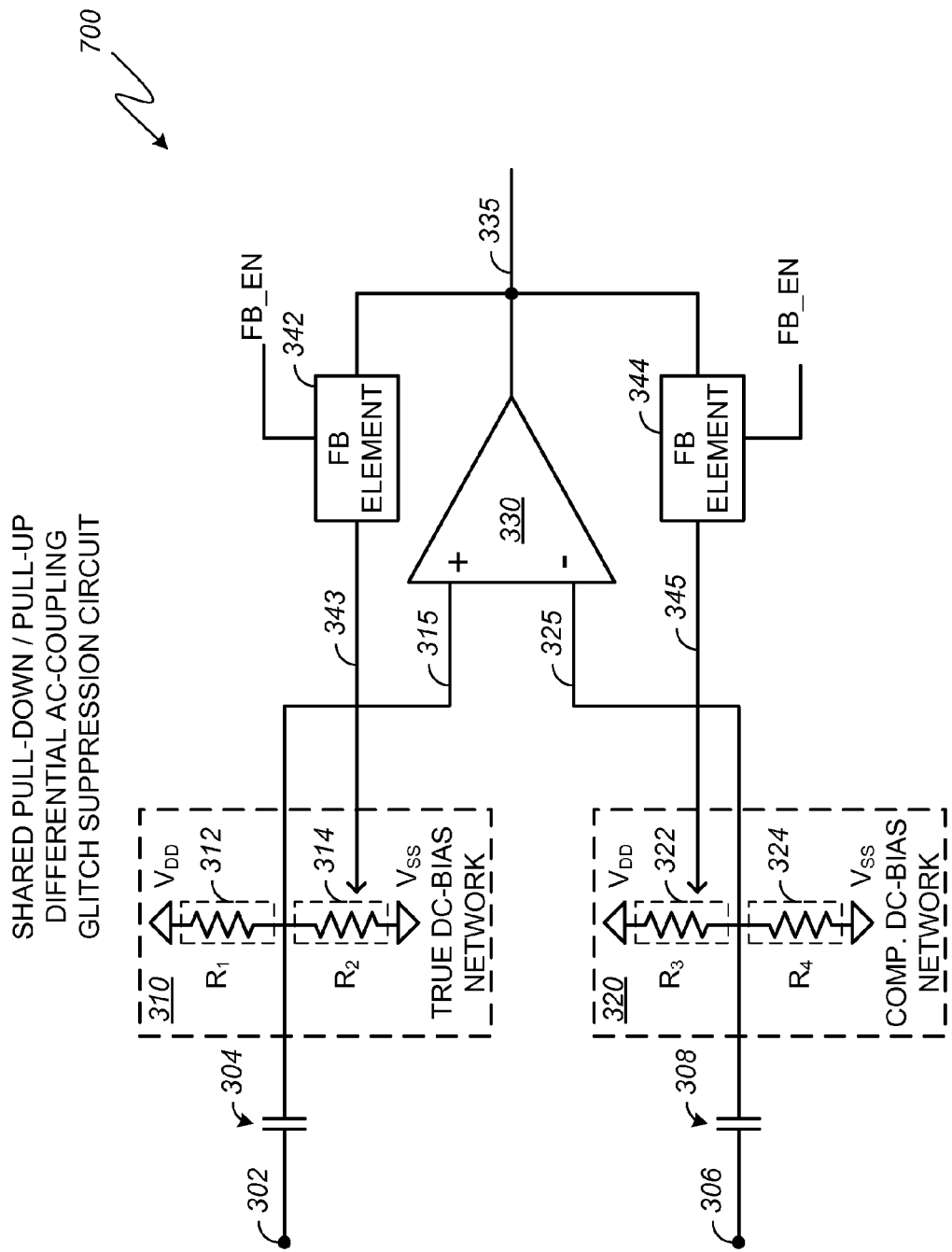
FIG. 7 is a schematic diagram illustrating an alternative embodiment of a differential AC-coupling circuit that employs shared pull-down and pull-up feedback control in respective DC-bias networks.

FIG. 7 is a schematic diagram illustrating an alternative embodiment of a differential AC-coupling circuit 700 that employs shared feedback control of a pull-up and a pull-down element in respective DC-bias networks. The AC-coupling circuit 700 differs from the AC-coupling circuit 300 illustrated in FIG. 3 in that the feedback element 340, connection 341, feedback element 346, and connection 347 are removed. Unlike the dual feedback employed by the AC-coupling circuit 300 illustrated in FIG. 3, the AC-coupling circuit 700 adjusts the true DC-bias network 310 and the complimentary DC-bias network 320 by using the feedback element 342 to generate and apply a control signal to only the second branch 314 of the true DC-bias network 310 and by using the feedback element 344 to generate and apply a control signal to the third branch 322 of the complimentary DC-bias network 320. The AC-coupling circuit 700 adjusts the relative resistances of the resistor $R_2$ such that the resistance of $R_1$ is not equivalent to the resistance of $R_2$. This modifies or offsets the voltage at the non-inverting input of the operational amplifier 330 in the absence of a transitioning signal at input node 302. In addition, the AC-coupling circuit 700 adjusts the relative resistances of the resistor $R_3$ such that the resistance of $R_3$ is not equivalent to the resistance of $R_4$. This modifies or offsets the voltage at the inverting input of the operational amplifier 330 in the absence of a transitioning signal at input node 306.

Figure 8:
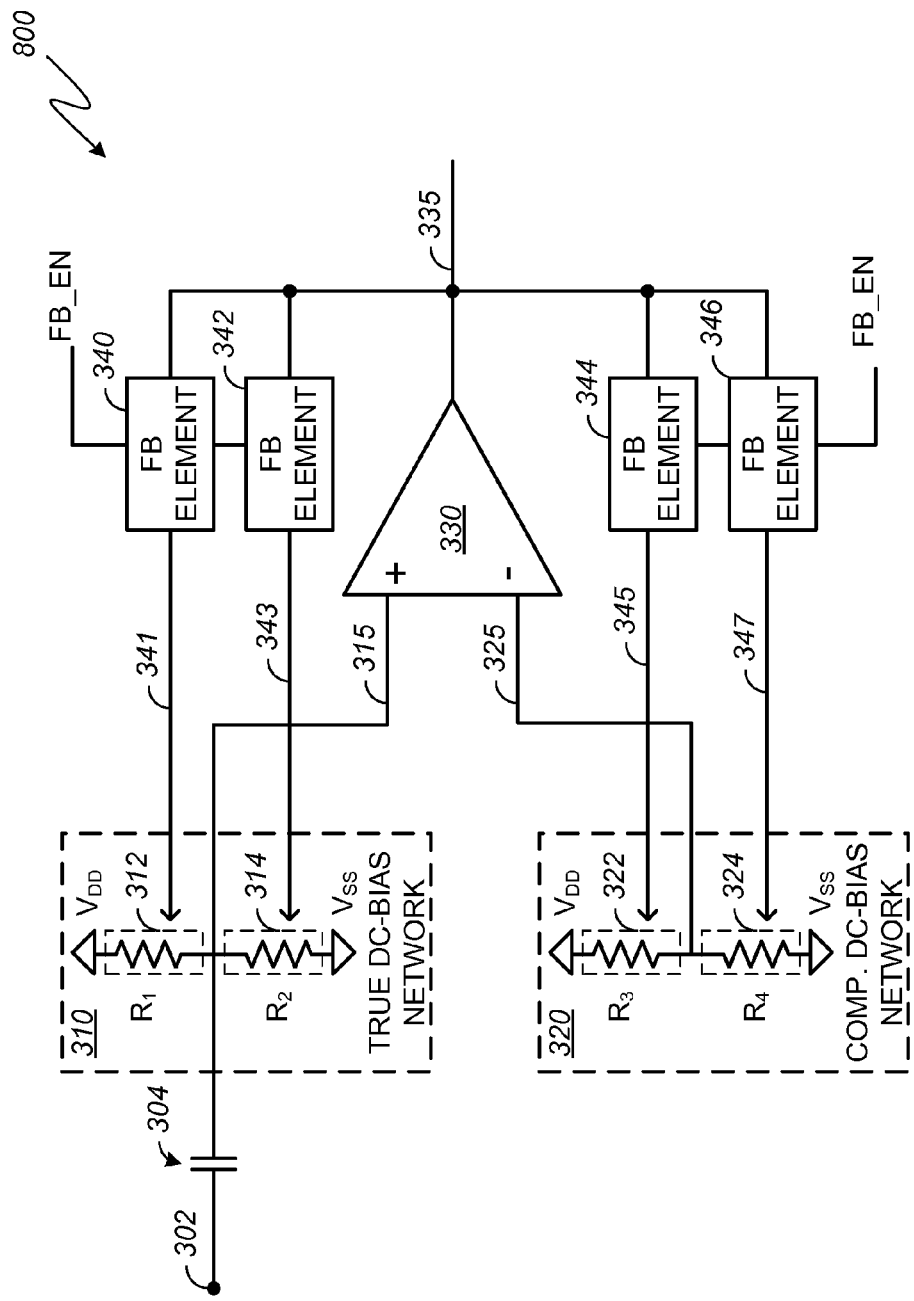
FIG. 8 is a schematic diagram of an embodiment of a single-ended AC-coupling circuit that employs dual feedback control of DC-bias networks.

FIG. 8 is a schematic diagram of an embodiment of a single-ended AC-coupling circuit 800 that employs dual feedback control of DC-bias networks. The AC-coupling circuit 800 differs from the AC-coupling circuit 300 illustrated in FIG. 3 in that the AC-coupling circuit 800 receives a single-ended input at the input node 302. The AC-coupling circuit 800 adjusts the true DC-bias network 310 and the complimentary DC-bias network 320 by using the feedback elements 340, 342 to generate and apply respective control signals to the first branch 312 and the second branch 314 of the true DC-bias network 310 and by using the feedback elements 344, 346 to generate and apply respective control signals to the third branch 322 and the fourth branch 324 of the complimentary DC-bias network 320. The AC-coupling circuit 800 adjusts the relative resistances of the resistor $R_1$ and the resistor $R_2$ such that the resistance of $R_1$ is not equivalent to the resistance of $R_2$. This modifies or offsets the voltage at the non-inverting input of the operational amplifier 330 in the absence of a transitioning signal at input node 302. In addition, the AC-coupling circuit 800 adjusts the relative resistances of the resistor $R_3$ and the resistor $R_4$ such that the resistance of $R_3$ is not equivalent to the resistance of $R_4$. This modifies or offsets the voltage at the inverting input of the operational amplifier 330.

Figure 9:
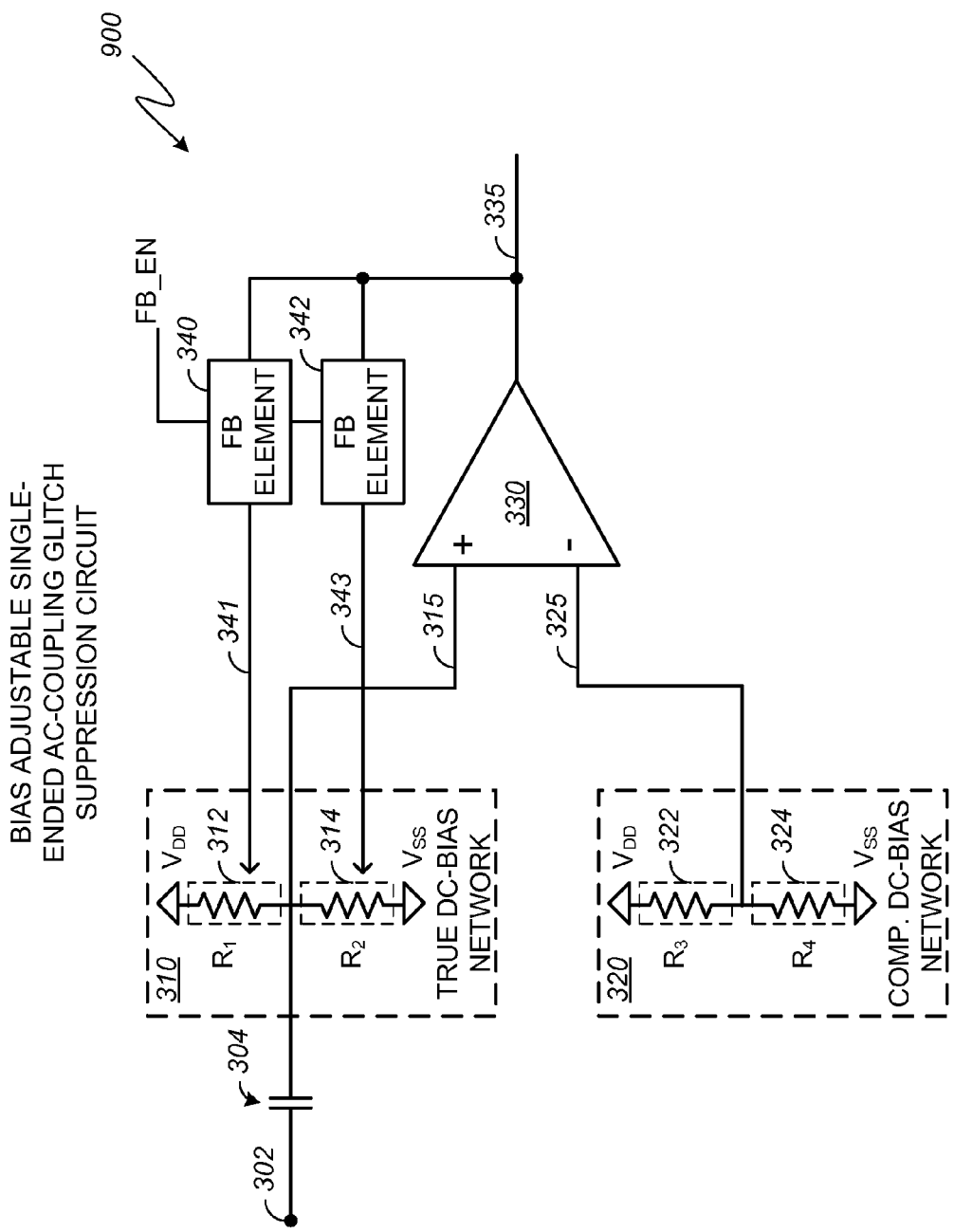
FIG. 9 is a schematic diagram of an embodiment of a single-ended AC-coupling circuit that employs dual feedback control of a true DC-bias network.

FIG. 9 is a schematic diagram of an embodiment of a single-ended AC-coupling circuit 900 that employs dual feedback control of a true DC-bias network. The AC-coupling circuit 900 differs from the AC-coupling circuit 800 illustrated in FIG. 8 in that the feedback element 344, connection 345, feedback element 346, and connection 347 are removed. Unlike the dual feedback employed by the AC-coupling circuit 800 illustrated in FIG. 8, the AC-coupling circuit 900 adjusts the true DC-bias network 310 by using the feedback element 340 to generate and apply a control signal to the first branch 312 and by using the feedback element 342 to generate and apply a control signal to second branch 314 of the true DC-bias network 310. The AC-coupling circuit 900 adjusts the relative resistances of the resistor $R_1$ and the resistor $R_2$ such that the resistance of $R_1$ is not equivalent to the resistance of $R_2$. This modifies or offsets the voltage at the non-inverting input of the operational amplifier 330 in the absence of a transitioning signal at input node 302. The AC-coupling circuit 900 does not adjust the complimentary DC-bias network 320. Consequently, the voltage at the inverting input of the operational amplifier 330 is permitted to exponentially reach a steady-state DC-bias voltage.

Figure 10:
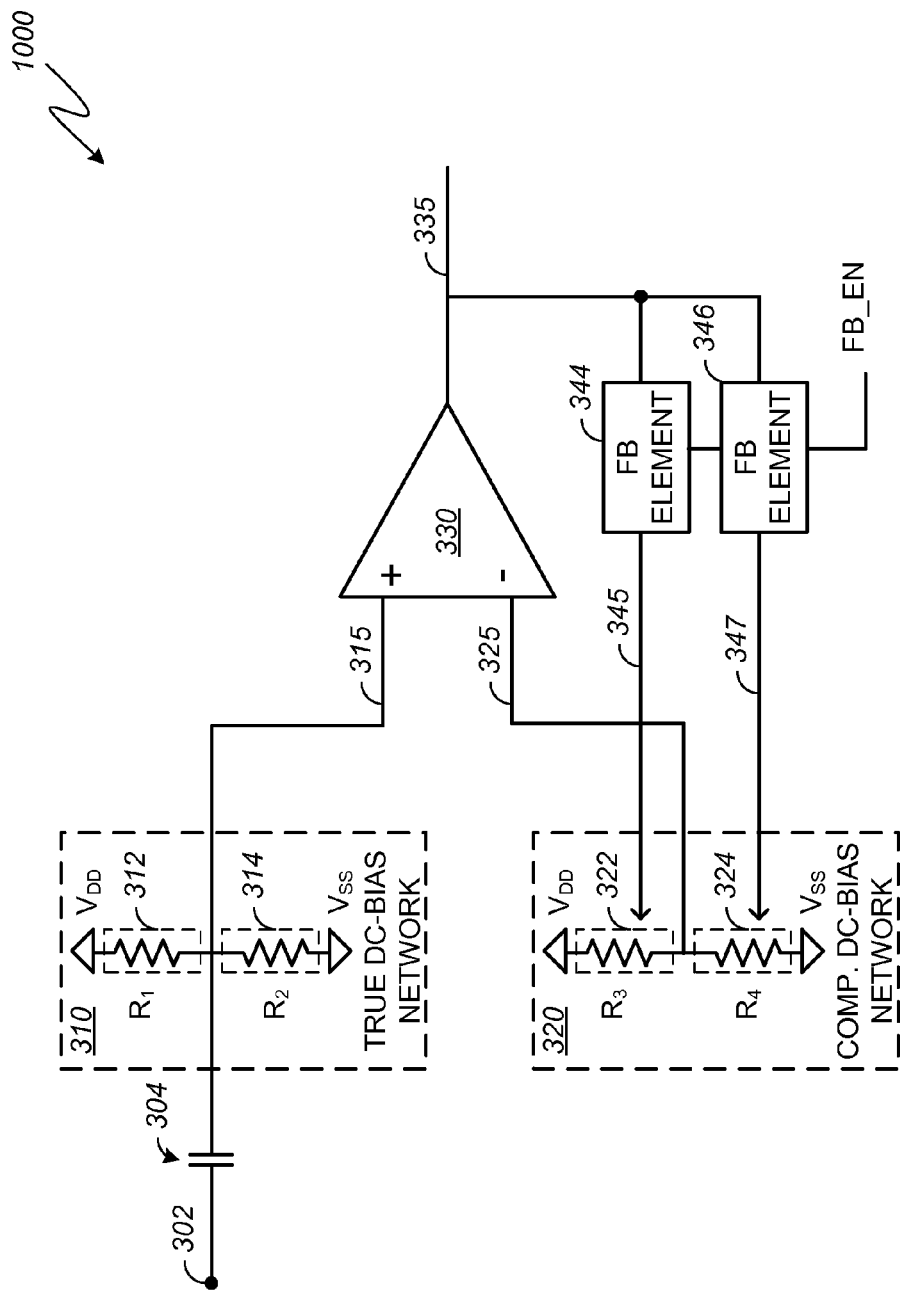
FIG. 10 is a schematic diagram of an embodiment of a single-ended AC-coupling circuit that employs dual feedback control of a complimentary DC-bias network.

FIG. 10 is a schematic diagram of an embodiment of a single-ended AC-coupling circuit 1000 that employs dual feedback control of a complimentary DC-bias network. The AC-coupling circuit 1000 differs from the AC-coupling circuit 800 illustrated in FIG. 8 in that the feedback element 340, connection 341, feedback element 342, and connection 343 are removed. Unlike the dual feedback employed by the AC-coupling circuit 800 illustrated in FIG. 8, the AC-coupling circuit 1000 adjusts the complimentary DC-bias network 320 by using the feedback element 344 to generate and apply a control signal to the first branch 322 and by using the feedback element 346 to generate and apply a control signal to the second branch 324 of the complimentary DC-bias network 320. The AC-coupling circuit 1000 adjusts the relative resistances of the resistor $R_3$ and the resistor $R_4$ such that the resistance of $R_3$ is not equivalent to the resistance of $R_4$. This modifies or offsets the voltage at the inverting input of the operational amplifier 330. The AC-coupling circuit 1000 does not adjust the true DC-bias network 310. Consequently, the voltage at the non-inverting input of the operational amplifier 330 is permitted to exponentially reach a steady-state DC-bias voltage.

Figure 11:
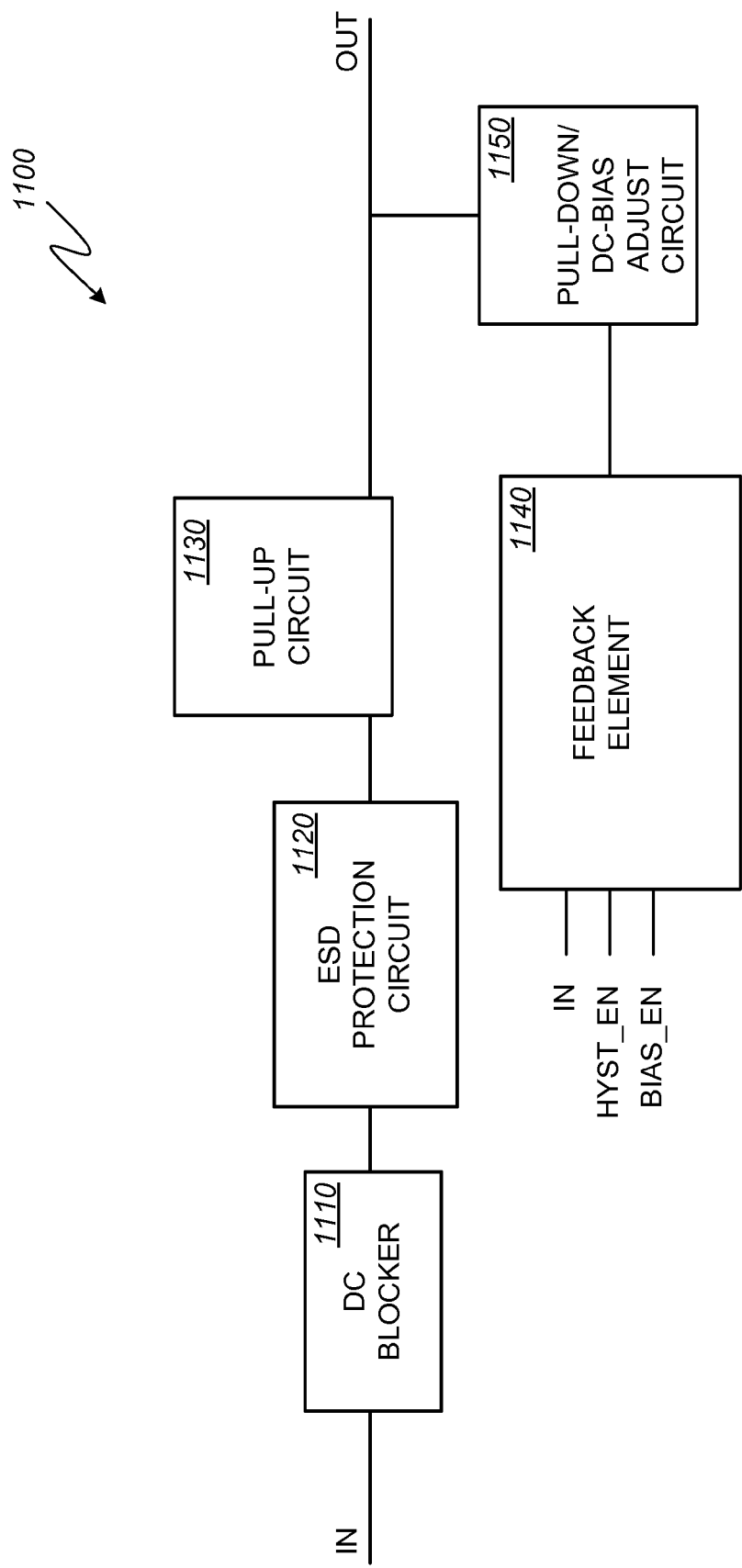
FIG. 11 is a functional block diagram illustrating an embodiment of a branch of the shared pull-down differential AC-coupling circuit of FIG. 6.

FIG. 11 is a functional block diagram illustrating an embodiment of a branch 1100 of the shared pull-down differential AC-coupling circuit 600 of FIG. 6. The branch 1100 includes a DC blocker element 1110, an electrostatic discharge (ESD) protection circuit 1120, a pull-up circuit 1130, a feedback element 1140 and a pull-down/DC-bias adjust circuit 1150. In addition to the AC-coupling circuit 600 of FIG. 6, the branch 1100 includes the ESD protection circuit 1120 and has hysteresis feedback disable functionality.

The DC blocker element 1110 receives an input signal and forwards transition events in the input signal to the ESD protection circuit 1120. The ESD protection circuit 1120 receives the transition events and forwards the same in the absence of an ESD event to the pull-up circuit 1130. The feedback element 1140 receives a representation of the input signal (i.e., IN) as well as hysteresis and bias enable control signals and uses these signals to generate a control signal which is controllably applied to the pull-down/DC-bias adjust circuit 1150 to controllably pull-down the voltage at the output of the branch. When implemented in an AC-coupling circuit, the output of the branch 1100 will be coupled to one of the inverting or non-inverting inputs of an operational amplifier.

Figure 12:
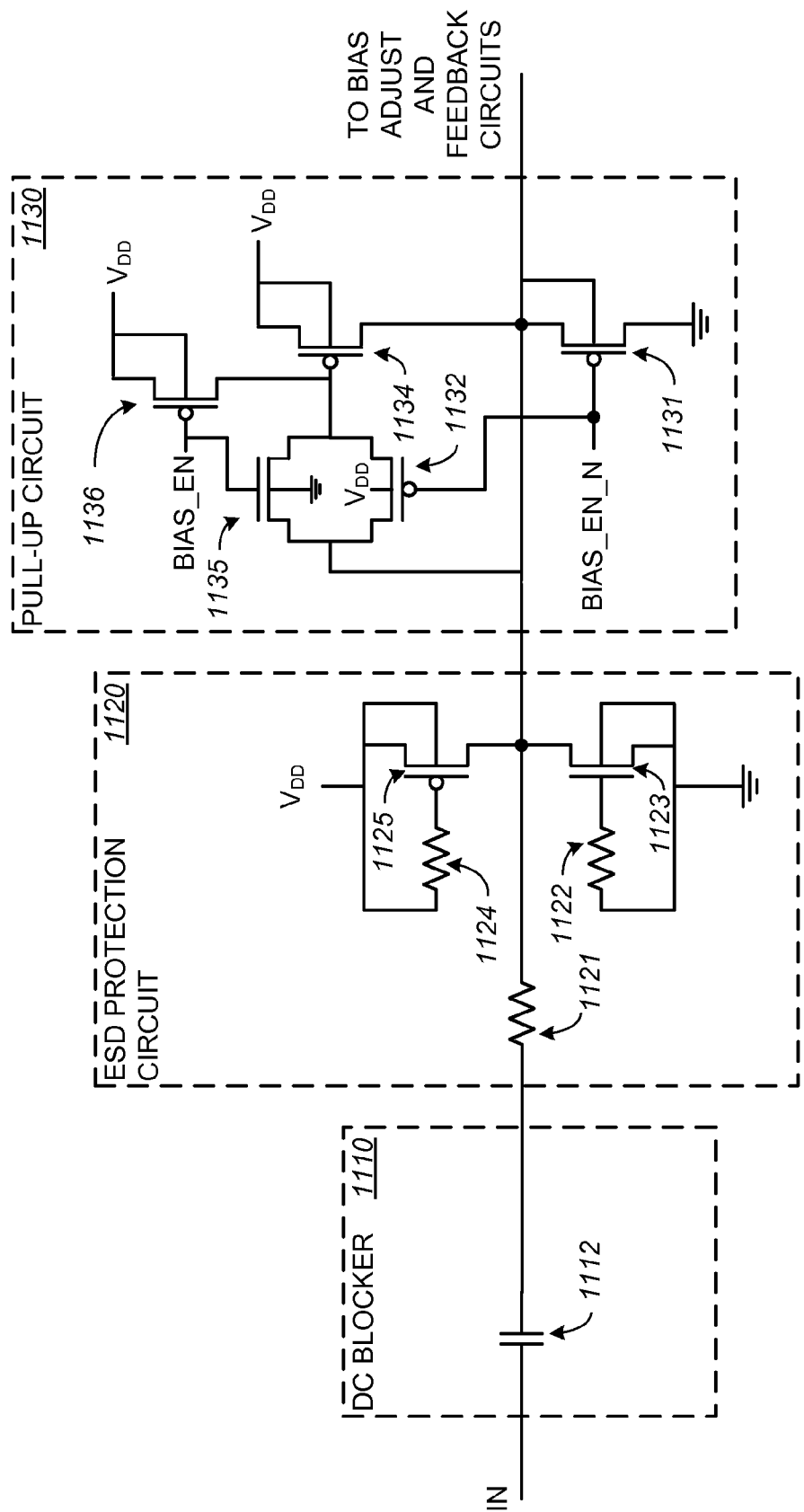
FIG. 12 is a schematic diagram illustrating example embodiments of the DC blocker, the ESD protection circuit and the pull-up circuit of the branch of the shared pull-down differential AC-coupling circuit of FIG. 11.

FIG. 12 is a schematic diagram illustrating example embodiments of the DC Blocker, 1110 the ESD protection circuit 1120 and the pull-up circuit 1130 of the branch 1100 of the shared pull-down differential AC-coupling circuit of FIG. 11. The DC blocker element 1110 includes a DC-blocking capacitor 1112, which forwards signal transitions or edge events to the ESD protection circuit 1120.

The ESD protection circuit 1120 includes a current limiting resistor 1121, a second resistor 1122, a n-type field effect transistor (NFET) 1123, a third resistor 1124 and a p-type field effect transistor 1125. A lower half of the ESD protection circuit 1120 including the second resistor 1122 and the NFET 1123 is coupled between the output (i.e., the connection to the bias adjust and feedback circuits) and electrical ground with the source of the NFET coupled to the output. The drain and the body of the NFET are coupled to electrical ground. The second resistor 1122 is coupled between the gate and the drain of the NFET 1123. An upper half of the ESD protection circuit 1120, which includes the third resistor 1124 and the PFET 1125, is coupled between $V_{DD}$ and the output. The source and the body of the PFET are coupled to $V_{DD}$ and the drain of the PFET coupled to the output. The third resistor 1124 is coupled between the gate and the source of the PFET 1125.

The pull-up circuit 1130 includes a lower portion and an upper portion. The lower portion includes PFET 1131. The drain of the PFET 1131 is coupled to electrical ground. The gate of the PFET 1131 receives a BIAS_EN_N signal. The source and the body of the PFET 1131 are coupled to the output (i.e., the connection to the bias adjust circuit and the feedback circuit.) The upper portion of the pull-up circuit includes NFET 1135, PFET 1132, PFET 1134 and PFET 1136. The gate of PFET 1132 receives the BIAS_EN_N signal. The source of PFET 1132 is coupled to the source of NFET 1135 the gate of PFET 1134 and the drain of PFET 1136. The drain of PFET 1132 is coupled to the drain of NFET 1135 and to the output. The body of PFET 1132 is coupled to $V_{DD}$. The drain of PFET 1134 is coupled to the output with the source and body of PFET 1134 coupled to $V_{DD}$. The gate of PFET 1136 and the gate of NFET 1135 receive a BIAS_EN signal. The body of NFET 1135 is coupled to electrical ground. The source and body of PFET 1136 are coupled to $V_{DD}$.

Figure 13:
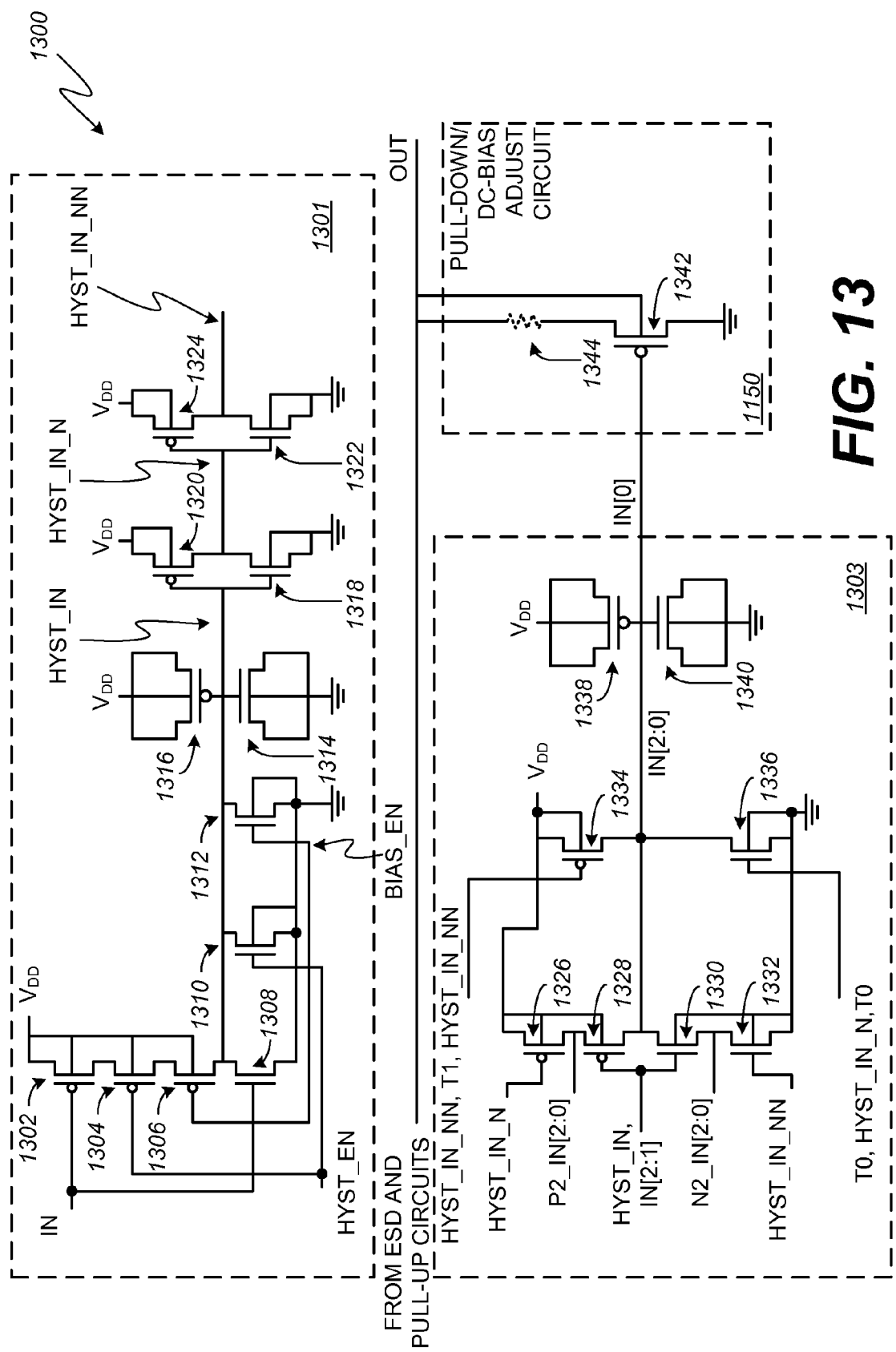
FIG. 13 is a schematic diagram illustrating example embodiments of the feedback element and the DC-bias adjust circuit of the shared pull-down differential AC-coupling circuit of FIG. 11.

FIG. 13 is a schematic diagram illustrating example embodiments of the feedback element and the pull-down/DC-bias adjust circuit of the branch of the shared pull-down differential AC-coupling circuit of FIG. 11. The feedback element includes an upper portion 1301 and a lower portion 1303. As indicated in FIG. 13, the upper portion 1301 receives an IN, HYST_EN, and BIAS_EN signals and generates HYST_IN, HYST_IN_N and HYST_IN_NN, which are provided to respective inputs of the lower portion 1303. The upper portion 1301 includes PFET 1302, PFET 1304, PFET 1306, PFET 1316, PFET 1320 and PFET 1324. The upper portion 1301 further includes NFET 1308, NFET 1310, NFET 1312, NFET 1314, NFET 1318 and NFET 1322. The upper portion 1301 of the feedback element is arranged as follows.

The signal labeled "IN" is coupled to the gate of PFET 1302 and the gate of NFET 1308. The source and the body of PFET 1302 are coupled to $V_{DD}$. The drain of PFET 1302 is coupled to the source of PFET 1304. The HYST_EN signal is coupled to the gate of PFET 1304 and the gate of NFET 1310. The body of PFET 1304 is coupled to $V_{DD}$. The drain of PFET 1304 is coupled to the source of PFET 1306. The drain of PFET 1306 is coupled to the source of NFET 1308, the source of NFET 1310 and the source of NFET 1312. The BIAS_EN signal is applied to the gate of PFET 1306, the gate of NFET 1312, the gate of PFET 1316, the gate of NFET 1314, the gate of PFET 1320 and the gate of NFET 1318. These terminals generate the HYST_IN control signal. The drain of NFET 1308, the drain of NFET 1310 and the drain of NFET 1312 are coupled to electrical ground. In addition, the body of NFET 1310 and the body of NFET 1312 are also coupled to electrical ground. The source, body and drain of NFET 1314 are coupled to electrical ground. The source, body and drain of PFET 1316 are coupled to $V_{DD}$. The drain and the body of NFET 1318 are coupled to electrical ground. The source and the body of PFET 1320 are coupled to $V_{DD}$. The drain of PFET 1320 and the source of NFET 1318 are coupled to the gate of PFET 1324 and to the gate of NFET 1322. These terminals generate the HSYT_IN_N control signal. The drain and the body of NFET 1322 are coupled to electrical ground. The source and the body of PFET 1324 are coupled to $V_{DD}$. The drain of PFET 1324 and the source of NFET 1322 generate the HSYT_IN_NN control signal.

The upper portion 1301 and the lower portion 1303 of the feedback element are separated by a signal connection. The signal connection receives an input from the ESD protection circuit 1120 and the pull-up circuit 1130 (FIG. 12) and generates an output suitable for application at an input of an operational amplifier as shown in FIG. 6.

As indicated in FIG. 13, the lower portion 1303 receives the HYST_IN, HYST_IN_N and HYST_IN_NN signals from the upper portion 1301. In addition, the lower portion 1303 of the feedback element receives T0, T1, N2_IN, IN, and PS_IN input signals. The lower portion 1303 includes PFET 1326, PFET 1328, NFET 1330, NFET 1332, PFET 1334, NFET 1336, PFET 1338 and NFET 1340. The lower portion 1303 of the feedback element is arranged as follows.

The HYST_IN_NN and T1 (i.e. logic high voltage) signals are alternatively applied at the gate of PFET 1334. The T0 (i.e., the logic low voltage) and HYST_IN_N signals are applied at the gate of NFET 1336. The source and the body of PFET 1326, the source and the body of PFET 1328, as well as the source and the body of PFET 1334 are coupled to $V_{DD}$. The body of NFET 1330, the body of NFET 1332 the body of NFET 1336, as well as the drain of NFET 1332 and the drain of NFET 1336 are coupled to electrical ground. The gate of PFET 1326 is configured to receive the HYST_IN_N signal. The gate of PFET 1328 and the gate of NFET 1330 receive the HYST_IN signal. The gate of NFET 1332 receives the HYST_IN_NN signal. The drain of PFET 1326 is coupled to the source of PFET 1328. These terminals receive the P2_IN signal. The drain of NFET 1330 is coupled to the source of NFET 1332. These terminals receive the N2_IN signal. The drain of PFET 1328, the drain of PFET 1334, the gate of PFET 1338, the gate of NFET 1340, the source of NFET 1336 and the source of NFET 1330 are coupled to each other along a connection that provides a control signal to the pull-down/DC-bias adjust circuit 1150. The source, the body and the drain terminals of PFET 1338 are coupled to $V_{DD}$. The source, the body and the drain terminals of the NFET 1340 are coupled to electrical ground.

The DC-bias adjust circuit 1150 includes PFET 1342. The gate of PFET 1342 receives the control signal from the lower portion 1303 of the feedback element. The drain of PFET 1342 is coupled to electrical ground. The source and the body of PFET 1342 are coupled to the connection labeled, OUT. As further illustrated in FIG. 13, by a resistor 1344 represented by a dashed line, the pull-down/DC-bias adjust circuit 1150 may also include a polysilicon resistor inserted between the source and the output of the DC-bias adjust circuit. When the polysilicon resistor is not present, the DC-bias adjust circuit 1150 pulls-down the output of the pull-down/DC-bias adjust circuit 1150 by decreasing the relative resistance of the PFET 1342 with respect to the resistance in the pull-up circuit 1130.

Figure 14:
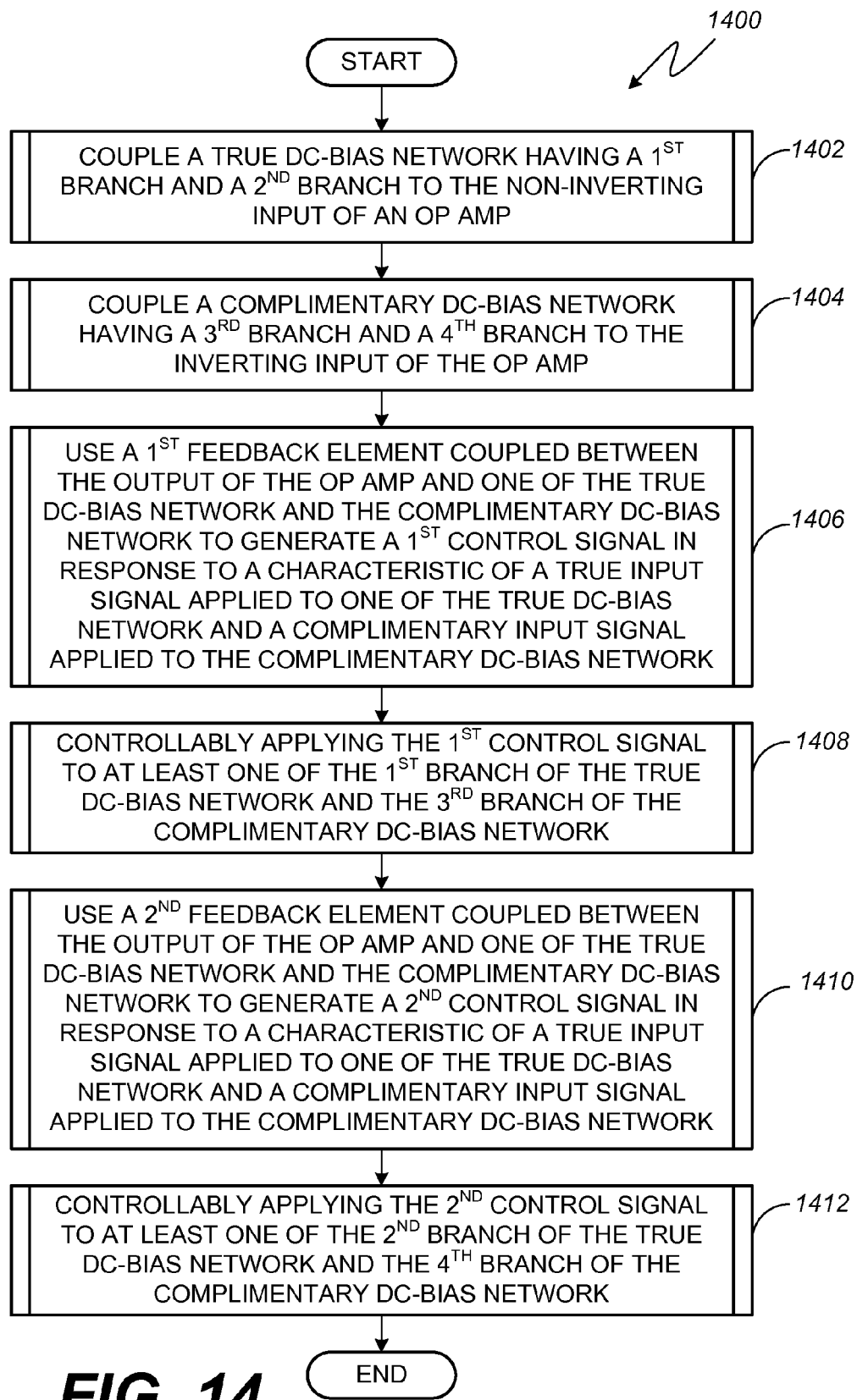
FIG. 14 is a flow chart illustrating an embodiment of a method for enabling high-speed AC-coupled networks to suppress noise during low-frequency operation.

FIG. 14 is a flow chart illustrating an embodiment of a method 1400 for enabling high-speed AC-coupled networks to suppress noise during low-frequency operation. The method 1400 begins with steps 1402 and 1404 where true and complimentary DC-bias networks are coupled to the non-inverting and inverting inputs of an operational amplifier, respectively. The true DC-bias network includes a first branch and a second branch. The complimentary DC-bias network includes a third branch and a fourth branch.

Thereafter, in step 1406, a first feedback element coupled between the output of the operational amplifier and one of the true DC-bias network and the complimentary DC-bias network is used to generate a first control signal in response to a characteristic of one of the true input signal applied to the true DC-bias network and a complimentary input signal applied to the complimentary DC-bias network. In block 1408, the first control signal is controllably applied to at least one of the first branch of the true DC-bias network and the third branch of the complimentary DC-bias network. In block 1410, a second feedback element coupled between the output of the operational amplifier and one of the true DC-bias network and the complimentary DC-bias network is used to generate a second control signal in response to a characteristic of one of the true input signal applied to the true DC-bias network and a complimentary input signal applied to the complimentary DC-bias network. In block 1412, the second control signal is controllably applied to at least one of the second branch of the true DC-bias network and the fourth branch of the complimentary DC-bias network.

While various example embodiments of the circuits and methods for enabling high-speed AC-coupled networks to suppress noise during low-frequency operation have been described, it will be apparent to those of ordinary skill in the art that many more embodiments and implementations are possible that are within the scope of this disclosure. Accordingly, the described circuits and methods for enabling high-speed AC-coupled networks to suppress noise during low-frequency operation are not to be restricted or otherwise limited except in light of the attached claims and their equivalents.

What is claimed is:

1. An alternating-current (AC) coupling integrated circuit (IC) for suppressing signal errors introduced by a steady-state input, the AC-coupling IC comprising:
    an operational amplifier having an inverting signal input, a non-inverting signal input, and an output;
    a true direct-current (DC) bias network having a first branch and a second branch, the first branch and the second branch of the true DC-bias network coupled to each other and to the non-inverting signal input;
    a complimentary DC-bias network having a third branch and a fourth branch, the third branch and the fourth branch of the complimentary DC-bias network coupled to each other and to the inverting signal input;
    a first feedback element coupled to the output of the operational amplifier and arranged to generate a first control signal in response to a characteristic of a true input signal applied to the true DC-bias network and a complimentary input signal applied to the complimentary DC-bias network; and
    a second feedback element coupled to the output of the operational amplifier and arranged to generate a second control signal in response to a characteristic of the true input signal and the complimentary input signal.

2. The AC-coupling IC of claim 1, wherein the first feedback element and the second feedback element are responsive to a frequency of one of the true input signal and the complimentary input signal.

3. The AC-coupling IC of claim 2, wherein when the frequency is less than a threshold frequency, the first feedback element generates the first control signal that produces an electrical mismatch between the first and second branches of the true DC-bias network or the third and fourth branches of the complimentary DC-bias network.

4. The AC-coupling IC of claim 3, wherein the first control signal is coupled to the first branch of the true DC-bias network and to the fourth branch of the complimentary DC-bias network.

5. The AC-coupling IC of claim 2, wherein when the frequency is less than a threshold frequency, the second feedback element generates the second control signal that produces an electrical mismatch between the first and second branches of the true DC-bias network or the third and fourth branches of the complimentary DC-bias network.

6. The AC-coupling IC of claim 5, wherein the second control signal is coupled to the second branch of the true DC-bias network and to the third branch of the complimentary DC-bias network.

7. The AC-coupling IC of claim 2, wherein when the frequency is greater than a threshold frequency, the first feedback element generates the first control signal that produces an electrical match between the first and second branches of the true DC-bias network or the third and fourth branches of the complimentary DC-bias network.

8. The AC-coupling IC of claim 2, wherein when the frequency is greater than a threshold frequency, the second feedback element generates the second control signal that produces an electrical match between the first and second branches of the true DC-bias network or the third and fourth branches of the complimentary DC-bias network.

9. The AC-coupling IC of claim 1, wherein the first feedback element and the second feedback element comprise respective networks of elements having one of a controllable resistance value and a controllable capacitance value.

10. The AC-coupling IC of claim 1, wherein a first instance of the first feedback element is coupled to the first branch of the true DC-bias network, a second instance of the first feedback element is coupled to the fourth branch of the complimentary DC-bias network, a first instance of the second feedback element is coupled to the second branch of the true DC-bias network, a second instance of the second feedback element is coupled to the third branch of the complimentary DC-bias network, the true DC-bias network further coupled to the true input signal via a first DC blocking capacitor, and the complimentary DC-bias network further coupled to the complimentary input signal via a second DC blocking capacitor.

11. The AC-coupling IC of claim 1, wherein a first instance of the first feedback element is coupled to the first branch of the true DC-bias network, a second instance of the first feedback element is coupled to the fourth branch of the complimentary DC-bias network, a first instance of the second feedback element is coupled to the second branch of the true DC-bias network, a second instance of the second feedback element is coupled to the third branch of the complimentary DC-bias network, the true DC-bias network is further coupled to a the true input signal via a DC blocking capacitor.

12. The AC-coupling IC of claim 1, wherein the first feedback element is coupled to the first branch of the true DC-bias network, the second feedback element is coupled to the third branch of the complimentary DC-bias network, the true DC-bias network is further coupled to the true input signal via a first DC blocking capacitor, and the complimentary DC-bias network is further coupled to the complimentary input signal via a second DC blocking capacitor.

13. The AC-coupling IC of claim 1, wherein a first instance of the first feedback element is coupled to the first branch of the true DC-bias network, a second instance of the first feedback element is coupled to the fourth branch of the complimentary DC-bias network, the true DC-bias network is further coupled to the true input signal via a first DC blocking capacitor, and the complimentary DC-bias network is further coupled to the complimentary input signal via a second DC blocking capacitor.

14. The AC-coupling IC of claim 1, wherein the first feedback element is coupled to the fourth branch of the complimentary DC-bias network, the second feedback element is coupled to the second branch of the true DC-bias network, the true DC-bias network is further coupled to the true input signal via a first DC blocking capacitor, and the complimentary DC-bias network is further coupled to the complimentary input signal via a second DC blocking capacitor.

15. The AC-coupling IC of claim 1, wherein a first instance of the second feedback element is coupled to the third branch of the complimentary DC-bias network, a second instance of the second feedback element is coupled to the third branch of the complimentary DC-bias network, the true DC-bias network is further coupled to the true input signal via a first DC blocking capacitor, and the complimentary DC-bias network is further coupled to the complimentary input signal via a second DC blocking capacitor.

16. The AC-coupling IC of claim 1, wherein the first feedback element is coupled to the first branch of the true DC-bias network, the second feedback element is coupled to the second branch of the true DC-bias network, and the true DC-bias network is further coupled to the true input signal via a DC blocking capacitor.

17. The AC-coupling IC of claim 1, wherein the first feedback element is coupled to the fourth branch of the complimentary DC-bias network, the second feedback element is coupled to the third branch of the complimentary DC-bias network, and the true DC-bias network is further coupled to the true input signal via a DC blocking capacitor.

18. A method for enabling high-speed AC-coupled networks to suppress noise during low-frequency operation, the method comprising:
   coupling a true DC-bias network having a first branch and a second branch to a non-inverting signal input of an operational amplifier;
   coupling a complimentary DC-bias network having a third branch and a fourth branch to an inverting input of the operational amplifier;
   using a first feedback element coupled between an output of the operational amplifier and one of the true DC-bias network and the complimentary DC-bias network to generate a first control signal in response to a characteristic of a true input signal applied to the true DC-bias network and a complimentary input signal applied to the complimentary DC-bias network;
   controllably applying the first control signal to at least one of the first branch of the true DC-bias network and the third branch of the complimentary DC-bias network;
   using a second feedback element coupled between the output of the operational amplifier and one of the true DC-bias network and the complimentary DC-bias network to generate a second control signal in response to the characteristic of the true input signal applied to the true DC-bias network and the complimentary input signal applied to the complimentary DC-bias network; and
   controllably applying the second control signal to at least one of the second branch of the true DC-bias network and the fourth branch of the complimentary DC-bias network.

19. The method of claim 18, wherein the steps of using a first feedback element and using a second feedback element are responsive to a frequency of one of the true input signal and the complimentary input signal.

20. The method of claim 18, wherein when the frequency is less than a threshold frequency, the first feedback element generates a first control signal that produces an electrical mismatch between the first and second branches of the true DC-bias network or the third and fourth branches of the complimentary DC-bias network such that the voltage at the non-inverting input of the operational amplifier is maintained above the steady-state common-mode voltage and such that the voltage at the inverting input of the operational amplifier is maintained below the steady-state common-mode voltage.

* * * * *